United States Patent
Lin et al.

(10) Patent No.: US 6,715,978 B2
(45) Date of Patent: Apr. 6, 2004

(54) INTERBAY TRANSFER INTERFACE BETWEEN AN AUTOMATED MATERIAL HANDLING SYSTEM AND A STOCKER

(75) Inventors: Li-Ren Lin, Hsin-Chu (TW); Cheng-Chang Chang, Tao-Yuan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 147 days.

(21) Appl. No.: 10/127,110

(22) Filed: Apr. 22, 2002

(65) Prior Publication Data
US 2003/0198540 A1 Oct. 23, 2003

(51) Int. Cl.$^7$ ................................................. B65G 1/06
(52) U.S. Cl. .......................... 414/416.05; 198/867.11; 198/867.14; 414/805; 414/940
(58) Field of Search .................. 198/803.14, 867.11, 198/867.14; 414/217, 805, 940, 416.05

(56) References Cited

U.S. PATENT DOCUMENTS

| | | | |
|---|---|---|---|
| 4,886,412 A | * 12/1989 | Wooding et al. | 414/416.05 |
| 5,411,358 A | * 5/1995 | Garric et al. | 414/277 |
| 5,588,791 A | * 12/1996 | Akagawa | 414/331.13 |
| 6,135,698 A | * 10/2000 | Bonora et al. | 414/416.01 |
| 6,431,814 B1 | * 8/2002 | Christensen et al. | 702/81 |
| 6,579,052 B1 | * 6/2003 | Bonora et al. | 414/222.01 |
| 6,599,075 B2 | * 7/2003 | Davis et al. | 414/217 |

FOREIGN PATENT DOCUMENTS

JP   9-260461   * 10/1997

* cited by examiner

*Primary Examiner*—Thomas J. Brahan
(74) *Attorney, Agent, or Firm*—Tung & Associates

(57) ABSTRACT

An interbay transfer interface between an automated material handling system and a stocker which includes a conveyor belt positioned juxtaposed to the stocker, a plurality of open-top containers positioned on the conveyor belt, at least two locating pins situated on the conveyor belt for engaging the containers, a wave emitting/receiving device positioned immediately adjacent to the conveyor belt, and a controller for receiving signals from the wave emitting/receiving device and sensors mounted on the locating pins.

16 Claims, 3 Drawing Sheets

INTERBAY TRANSFER INTERFACE BETWEEN AN AUTOMATED MATERIAL HANDLING SYSTEM AND A STOCKER

FIELD OF THE INVENTION

The present invention generally relates to an automated material handling system (AMHS) and stockers and more particularly, relates to an interbay transfer interface between an AMHS and a stocker by using open-top containers positioned on a conveyor belt for transporting wafer cassettes or other parts in-between stockers.

BACKGROUND OF THE INVENTION

In the manufacturing of a semiconductor device, the device is usually processed at many work stations or processing machines. The transporting or conveying of partially finished devices, or work-in-process (WIP) parts, is an important aspect in the total manufacturing process. The conveying of semiconductor wafers is especially important in the manufacturing of integrated circuit chips due to the delicate nature of the chips. Furthermore, in fabricating an IC product, a multiplicity of fabrication steps, i.e., as many as several hundred, is usually required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles or overhead transport vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

In an automatic material handling system (AMHS), stockers are widely used in conjunction with automatically guided or overhead transport vehicles, either on the ground or suspended on tracks, for the storing and transporting of semiconductor wafers in SMIF pods or in wafer cassettes. For instance, three possible configurations for utilizing a stocker may be provided. In case A, a stocker is utilized for storing WIP wafers in SMIF pods and transporting them first to tool A, then to tool B, and finally to tool C for three separate processing steps to be conducted on the wafers. After the processing in tool C is completed, the SMIF pod is returned to the stocker for possible conveying to another stocker. The configuration in case A is theoretically workable but hardly ever possible in a fabrication environment since the tools or processing equipment cannot always be arranged nearby to accommodate the processing of wafers in the stocker.

In the second configuration, a stocker and a plurality of buffer stations A, B and C are used to accommodate different processes to be conducted in tool A, tool B and tool C. A SMIF pod may be first delivered to buffer station A from the stocker and waits there for processing in tool A. Buffer stations B and C are similarly utilized in connection with tools B and C. The buffer stations A, B and C therefore become holding stations for conducting processes on the wafers. This configuration provides a workable solution to the fabrication process, however, requires excessive floor space because of the additional buffer stations required. The configuration is therefore not feasible for use in a semiconductor fabrication facility.

In the third configuration, a stocker is provided for controlling the storage and conveying of WIP wafers to tools A, B and C. After a SMIF pod is delivered to one of the three tools, the SMIF pod is always returned to the stocker before it is sent to the next processing tool. This is a viable process since only one stocker is required for handling three different processing tools and that no buffer station is needed. This configuration illustrates that the frequency of use of the stocker is extremely high since the stocker itself is used as a buffer station for all three tools. The accessing of the stocker is therefore more frequent than that required in the previous two configurations.

FIG. 1 illustrates a schematic of a typical automatic material handling system 20 that utilizes a central corridor 22, a plurality of bays 24 and a multiplicity of process machines 26. A multiplicity of stockers 30 are utilized for providing input/out to bay 24, or to precessing machines 26 located on the bay 24. The central corridor 22 designed for bay lay-out is frequently used in an efficient automatic material handling system to perform lot transportation between bays. In this configuration, the stockers 30 of the automatic material handling system become the pathway for both input and output of the bay. Unfortunately, the stocker 30 frequently becomes a bottleneck for internal transportation. It has been observed that a major cause for the stockers 30 to be the bottleneck is the input/output ports of the stockers.

In modern semiconductor fabrication facilities, especially for the 200 mm or 300 mm FAB plants, automatic guided vehicles (AGV) and overhead hoist transport (OHT) are extensively used to automate the wafer transport process as much as possible. The AGE and OHT utilize the input/output ports of a stocker to load or unload wafer lots, i.e. normally stored in POUFS. FIG. 2 is a perspective view of an overhead hoist transport system 32 consisting of two vehicles 34,36 that travel on a track 38. An input port 40 and an output port 42 are provided on the stocker 30. As shown in FIG. 2, the overhead transport vehicle 36 stops at a position for unloading a FOUP 44 into the input port 40. The second overhead transport vehicle 34 waits on track 38 for input from stocker 30 until the first overhead transport vehicle 36 moves out of the way.

Similarly, the OHT system is also used to deliver a cassette pod such as a FOUP to a process machine. This is shown in FIG. 3. When an OHT system is utilized in transporting a cassette pod to a process machine, problems arise when the interfab transportation plans uses a stocker (commonly known as an "AS/RS stocker") to deliver baskets, i.e., open-top containers, between fabs. It is therefore difficult to interface with an automated material handling system of the OHT inside a fab. Problems caused including the need for an operator to transfer a FOUP from a basket of an AS/RS stocker and the AMHS of the fab plant. One of the problems is ergonomics since the weight of a fully loaded FOUP is approximately 8.7 kg. Another problem is the need for reserving more fab space for buffering, which translates into more space requirements and the footprint occupied by the space.

It is therefore an object of the present invention to provide an interbay transfer interface between an automated material handling system and a stocker that does not have the drawbacks or shortcomings of the conventional interbay transfer interface.

It is another object of the present invention to provide an interbay transfer interface between an AMHS and a stocker that does not require manpower to transfer FOUP between an AS/RS stocker and a fab AMHS.

It is a further object of the present invention to provide an interbay transfer interface between an AMHS and a stocker that is capable of providing just-in-time delivery without the need of waiting for an operator.

It is another further object of the present invention to provide an interbay transfer interface between an AMHS and a stocker by using existing AMHS and related SEMI™ standard function for delivery.

It is still another object of the present invention to provide an interbay transfer interface between an AMHS and a stocker wherein materials between two or more fab plants may be transferred.

It is yet another object of the present invention to provide an interbay transfer interface between an AMHS and a stocker wherein sensors are utilized to detect the presence or absence of materials in an open-top container.

SUMMARY OF THE INVENTION

In accordance with the present invention, an interbay transfer interface between an automated material handling system and a stocker and a method for operating the interbay transfer interface are provided.

In a preferred embodiment, an interbay transfer interface between an automated material handling system (AMHS) and a stocker can be provided which includes a conveyor belt that is positioned juxtaposed to input/output ports of a first and a second stocker capable of moving an object therein between; a plurality of containers positioned on and carried by the conveyor belt, each of the plurality of containers further comprises an open-top for receiving the object from the AMHS therein; an aperture in each of the two opposing sidewalls forming a light passageway perpendicular to the conveyor belt, the aperture is formed in the sidewall at a height less than ½ of the height of the container; and at least two apertures in a bottom wall of the container for penetrating by at least two locating pins on the conveyor belt; at least two locating pins situated on the conveyor belt for engaging the at least two apertures in the bottom wall of the container, the locating pins further comprises sensors for sensing the presence of a container placed on top; a wave emitting/receiving device positioned juxtaposed to the conveyor belt for sending a wave through the apertures in the opposing sidewalls of the container for sensing the presence or absence of an object in the container; a controller for receiving signals from the wave emitting/receiving device and the sensors on the locating pins and for indicating a full/empty status of the container.

The interbay transfer interface between an AMHS and a stocker may further include a plurality of plates situated spaced-apart on the conveyor belt, each of the plurality of plates further includes at least two locating pins on a top surface of the plate for receiving the at least two apertures in the bottom wall of the container. Each of the bottom wall of the container may further include an indented area in a top planar surface for receiving a wafer cassette. The first stocker and the second stocker may be situated at least 10 m apart. The sensors on the at least two locating pins may be contact sensors, or may be weight sensor. The wave emitting/receiving device may be an optical wave emitting/receiving device, or a sound wave emitting/receiving device. The wave emitting/receiving device may be an infrared light emitting/receiving device. Each of the plurality of containers may further include a removable cover for sealing the open-top from dust.

The present invention is further directed to a method for the interbay transfer of an object between an AMHS and a stocker by the operating steps of first positioning a conveyor belt juxtaposed to input/output ports of a first and a second stocker capable of moving an object therein between; positioning and carrying a plurality of containers on and by the conveyor belt, each of the plurality of containers further includes an open-top for receiving the object from the AMHS therein; an aperture in each of two opposing sidewalls forming a light passageway perpendicular to the conveyor belt, the aperture being formed in the sidewall at a height less than ½ of the height of the container; and at least two apertures in a bottom wall of the container for penetrating by at least two locating pins on the conveyor belt; providing at least two locating pins on the conveyor belt and engaging the at least two apertures in the bottom wall of the container, the locating pins further includes sensors for sensing the presence of a container placed on top; sending a wave by a wave emitting/receiving device positioned juxtaposed to the conveyor belt through the apertures in the opposing sidewalls of the container and sensing the presence or absence of an object in the container; sending signals to a controller from the wave emitting/receiving device and the sensors on the locating pins indicating a full/empty status of the container; and conveying the object in the container from the first stocker to the second stocker.

The method for the interbay transfer of an object between an AMHS and a stocker may further include the step of covering the open-top of the container with a dust-proof cover. The method may further include the step of sending an infrared light by an infrared emitting/receiving device through the apertures in the opposing sidewalls of the container, or sending an ultrasonic wave by an ultrasonic wave emitting/receiving device through the apertures in the opposing sidewalls of the container. The method may further include the step of mounting a plurality of plates spaced-apart on the conveyor belt, each of the plurality of plates includes at least two locating pins for receiving the at least two apertures in the bottom wall of the container. The method may further include the step of providing an indented area in a top surface of the bottom wall of the container; and positioning a wafer cassette in the indented area.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an interbay transfer interface between an automated material handling system and a stocker and a method for operating the interbay transfer interface.

The interbay transfer interface is constructed of a conveyor belt, a plurality of open-top containers positioned on the belt, a plurality of locating belts on the belt for locating the containers, a wave emitting/receiving device and a controller for receiving signals from the wave emitting/receiving device and the sensors on the locating pins.

In the preferred embodiment, the interbay transfer interface is constructed of a conveyor belt that is positioned immediately adjacent to the input/output ports of a first stocker and a second stocker. The conveyor belt is capable of moving an object such as a wafer cassette or any other materials in-between the two stockers. A plurality of open-top containers, such as baskets, are positioned spaced-apart on and carried by the conveyor belt. Each of the plurality of open-top containers may further include an open top for receiving an object from the AMHS, i.e. or the overhead hoist transport system of the AMHS. The containers further include an aperture in each of the two opposing sidewalls to form a wave passageway that is perpendicular to the conveyor belt direction. The apertures should be provided in the sidewalls at a height that is not more than ½ of the height of the container, such that any short objects placed in the container may also be detected. The container should further be provided with at least two apertures in a bottom wall for penetrating by at least two locating pins provided on the conveyor belt.

Figure 1:
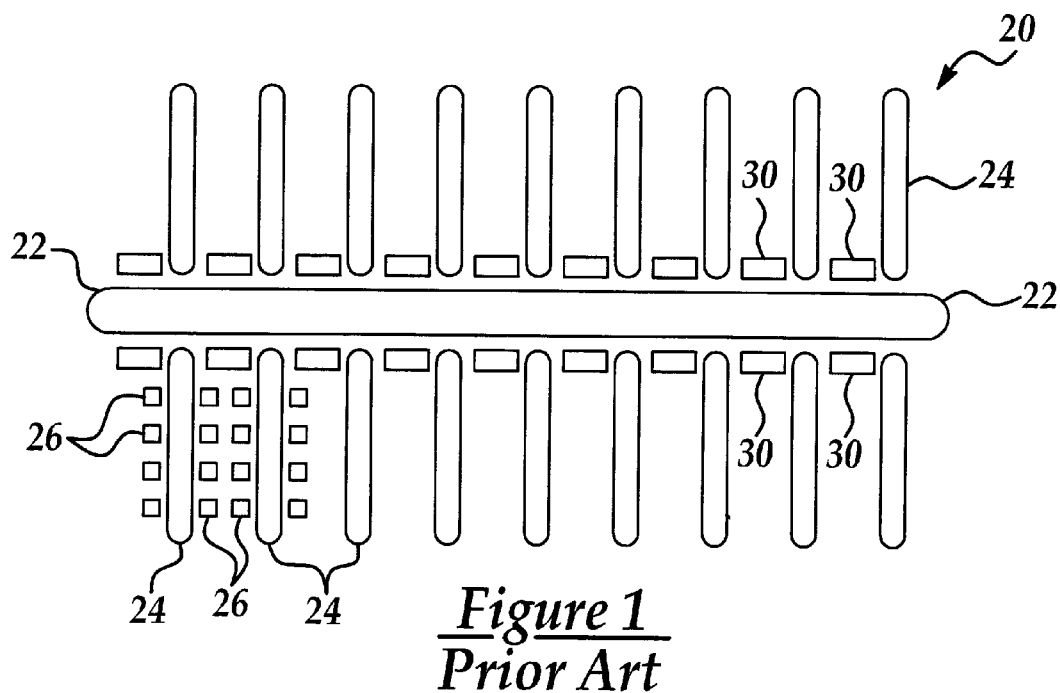
FIG. 1 is a schematic illustrating a conventional automatic material handling system utilizing a central corridor for intra-bay transport.
Figure 2:
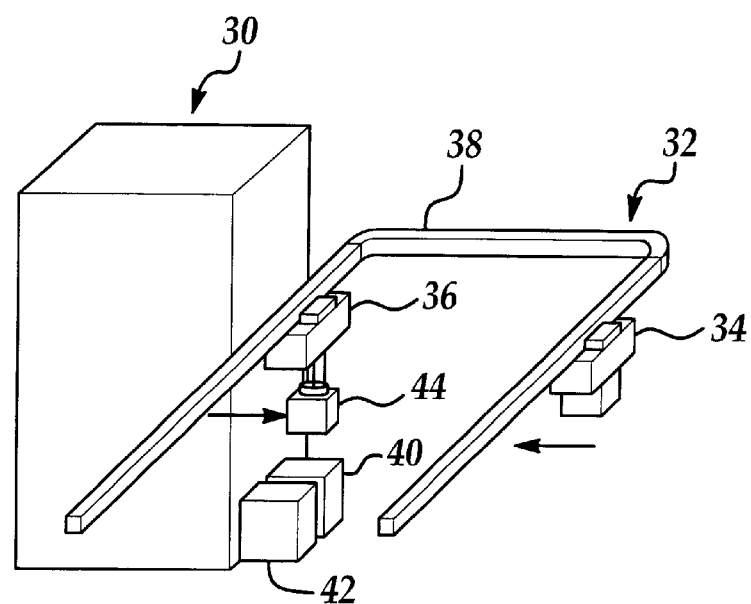
FIG. 2 is a schematic illustrating a conventional overhead hoist transport system for accessing a stocker.
Figure 3:
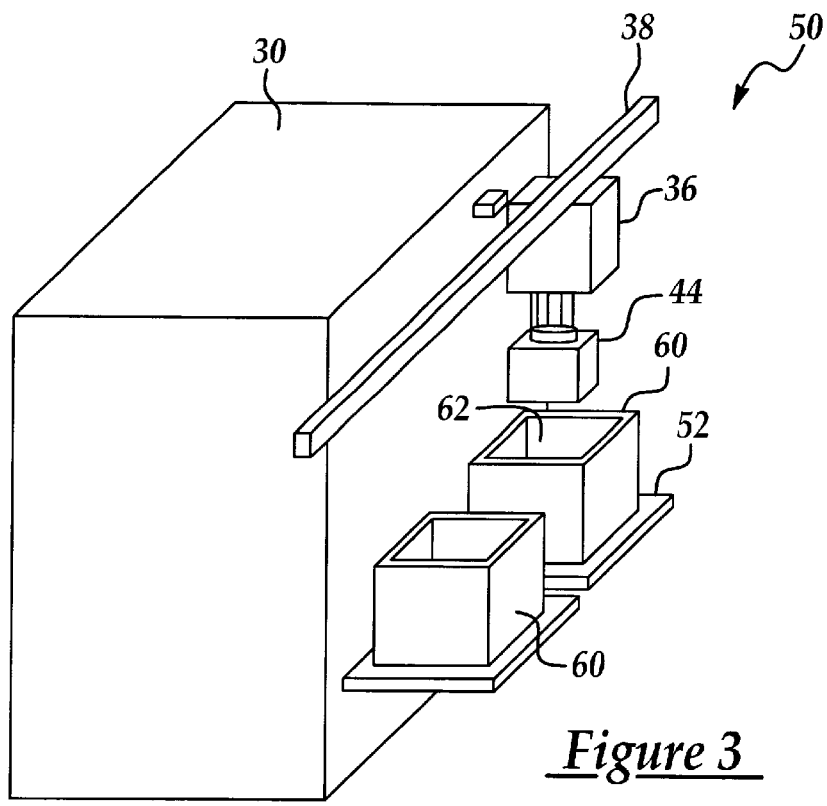
FIG. 3 is a schematic illustrating a present invention overhead hoist transport system incorporating a conveyor belt and open-top containers.

Referring now to FIG. 3, wherein a schematic of a present invention interbay transfer interface 50 is shown. Similar to the OHT system 32 shown in FIG. 2, a vehicle 36 rides on the OHT track 38. A FOUP 44 is carried by the OHT vehicle 36. The interbay transfer interface 50 is provided with a conveyor belt 52 (only part of the conveyor belt 52 is shown in FIG. 3 for simplicity reasons). A plurality of open-top containers 60 are positioned spaced-apart on the conveyor belt 52 for accepting a FOUP 44 into cavity 62 of the container.

Figure 4:
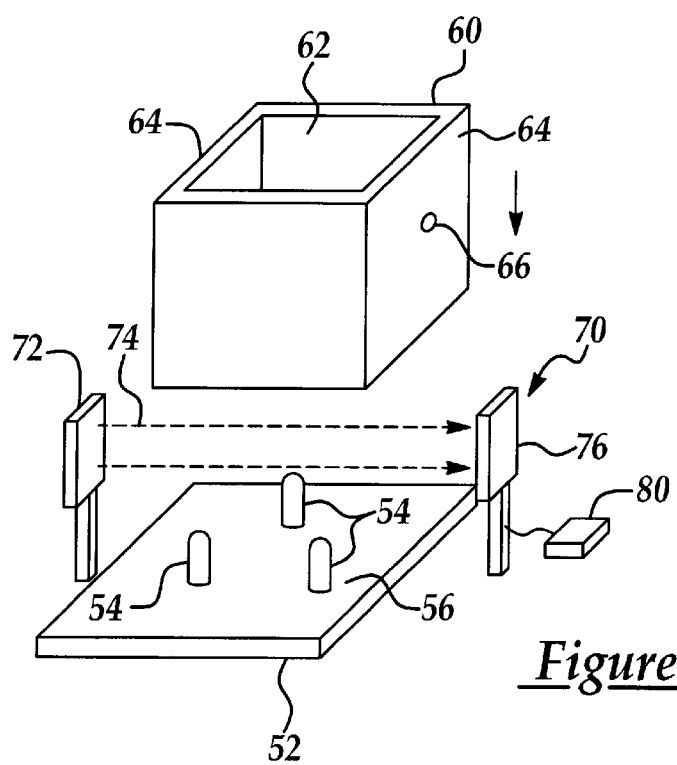
FIG. 4 is a schematic illustrating the wave emitting/receiving device and the locating pins on the conveyor belt for placing the open-top container.

A more detailed view of the open-top container 60, the conveyor belt 52, a wave emitting/receiving device 70 and a plurality of locating pins 54 are shown in FIG. 4. In the sidewall 64 of the open-container 60, at least one aperture 66 is provided through the sidewall 64 for penetrating by a wave produced by the wave emitter 72. When the open-top container 60 is seated on the conveyor 52, the wave 74 generated by the wave emitter 72 penetrates through the apertures 66 and is received by the wave receiver 76. However, if an object such as a wafer cassette or any other material is positioned inside the cavity 62 of the container 60, the wave 74 would be blocked by the object and not received by the receiver 76. Signals are thus sent to a controller 80 from the receiver 76.

The wave emitting/receiving device can be advantageously an optical wave or a sound wave emitting/receiving device. For instance, when an optical wave is utilized, an infrared light beam may be advantageously emitted from the wave emitter 72 and received by the wave receiver 76. When a sound wave is utilized, an ultrasonic wave can be easily adapted in a similar manner.

The locating pins 54 provided on the top surface 56 of the conveyor 52 are designed to penetrate apertures (not shown) on the bottom wall (not shown) of the open-top container 60. This provides an easy means for accurately locating an open-top container on the conveyor 52. At least two locating pins 54 should be utilized in order to pinpoint the locating of the open-top container 60.

The aperture 66 provided in the sidewall 64 of the open-top container 60 should be at a height that is less than ½ of the height of the container 60 such that even a short object placed in the cavity 62 can be detected.

Figure 5A:
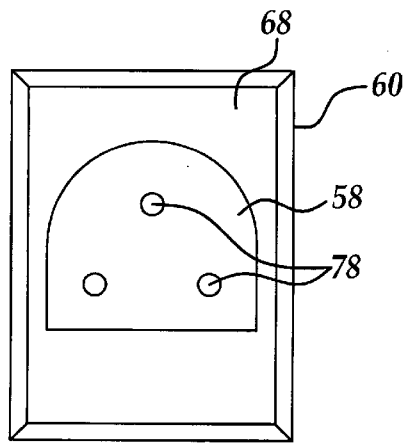
FIG. 5A is a top view illustrating the present invention open-top container with a FOUP positioned therein.
Figure 5B:
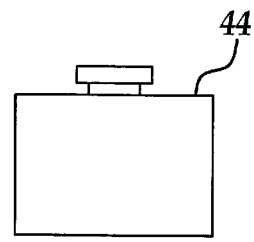
FIG. 5B is a cross-sectional view of the present invention open-top container and corresponding locating pins on a conveyor belt.
Figure 5B:
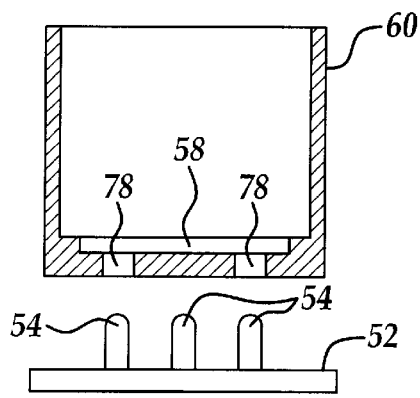
Figure 5C:
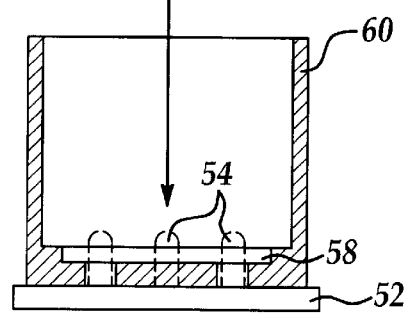
FIG. 5C is a cross-sectional view of the present invention open-top container positioned on the conveyor belt for receiving a wafer cassette.

Referring now to FIGS. 5A, 5B and 5C, which illustrate the present invention open-top container 60, the conveyor 52 and a FOUP 44. FIG. 5A is a top view of the open-top container 60 looking down onto a bottom wall 68 of the container. In the top surface of the bottom wall 68, an indented area 58 in the shape of a FOUP is provided. Apertures 78 are also provided in the bottom wall 68 of the container 60 for engaging the locating pins 54 of the conveyor 52. A cross-sectional view of the open-top container 60 is shown in FIG. 5B. Similarly a cross-sectional view of the open-top container 60 engaging the conveyor 52, i.e. with the apertures 78 engaging the locating pins 54, is shown in FIG. 5C.

Figure 6:
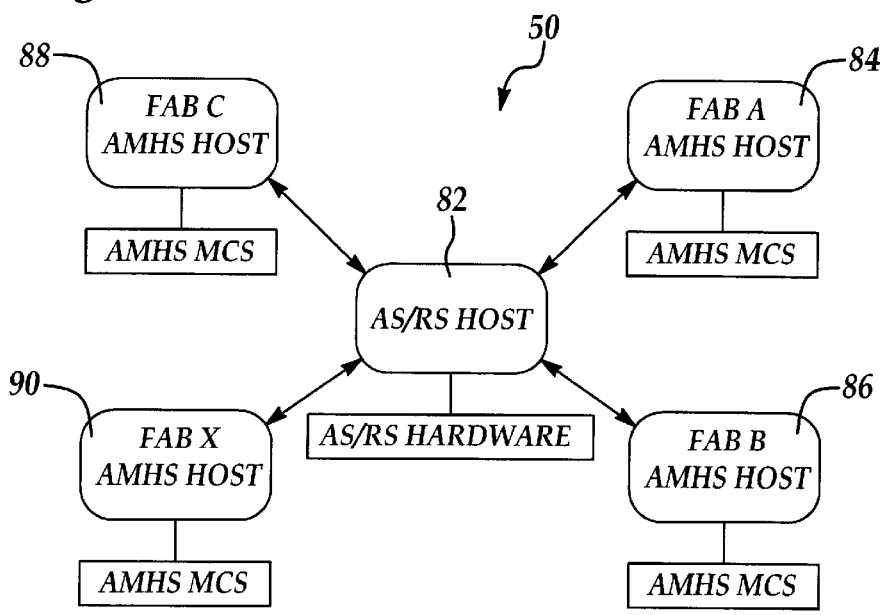
FIG. 6 is a schematic view illustrating the operating principles of the present invention interface between different fab plants and a central host warehouse.

The operation of the present invention interbay transfer interface 50 is shown in FIG. 6.

A host computer 82 is utilized to control the AS/RS stocker 30 (shown in FIG. 3). The host computer 82 has the capability of communicating with various AMHS hosts 84, 86, 88 and 90 located in fab plant A, fab plant B, fab plant C and fab plant X, respectively. The AS/RS host computer 82 performs inter-fab backup and tracks in/out with MES. The architecture of the operation is shown in FIG. 6.

The AS/RS host computer 82 can issue MIR (material-in request) or MOR (material-out request) to the AMHS hosts 84, 86, 88 and 90 based on the communication between the AS/RS host computer 82 and the AS/RS stocker 30 such that the interface between AMHS and the AS/RS stocker can be similarly performed as in-between AMHS and tool.

The present invention novel interbay transfer interface between an AMHS and a stocker and a method for operating the interface have therefore been amply described in the above description and in the appended drawings of FIGS. 3–6.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. An interbay transfer interface between an automated material handling system (AMHS) and a stocker comprising:
    a conveyor belt positioned juxtaposed to input/output ports of a first and a second stocker capable of moving an object therein between;
    a plurality of containers positioned on and carried by said conveyor belt, each of said plurality of containers further comprises:
        an open top for receiving said object from said AMHS therein;
        an aperture in each of two opposing sidewalls forming a light passageway perpendicular to said conveyor belt, said aperture being formed in said sidewall; and
        at least two apertures in a bottom wall of said container for penetrating by at least two locating pins on said conveyor belt;
    at least two locating pins situated on said conveyor belt for engaging said at least two apertures in said bottom wall of the container, said locating pins further comprises sensors for sensing the presence of a container placed on top;
    a wave emitting/receiving device positioned juxtaposed to said conveyor belt for sending a wave through said apertures in said opposing sidewalls of the container for sensing the presence or absence of an object in said container;
    a controller for receiving signals from said wave emitting/receiving device and said sensors on said locating pins and for indicating a full/empty status of said container.

2. An interbay transfer interface between an AMHS and a stocker according to claim 1 further comprising a plurality of plates situated spaced-apart on said conveyor belt, each of said plurality of plates further comprises at least two locating pins on a top surface of the plate for receiving said at least two apertures in said bottom wall of the container.

3. An interbay transfer interface between an AMHS and a stocker according to claim 2, wherein each of said bottom wall of the container further comprises an indented area in a top planar surface for receiving a wafer cassette.

4. An interbay transfer interface between an AMHS and a stocker according to claim 1, wherein said first stocker and said second stocker are situated at least 10 m apart.

5. An interbay transfer interface between an AMHS and a stocker according to claim 1, wherein said sensors on said at least two locating pins are contact sensors.

6. An interbay transfer interface between an AMHS and a stocker according to claim 1, wherein said sensors on said at least two locating pins are weight sensor.

7. An interbay transfer interface between an AMHS and a stocker according to claim 1, wherein said wave emitting/receiving device is an optical wave emitting/receiving device.

8. An interbay transfer interface between an AMHS and a stocker according to claim 1, wherein said wave emitting/receiving device is a sound wave emitting/receiving device.

9. An interbay transfer interface between an AMHS and a stocker according to claim 1, wherein said wave emitting/receiving device is an infrared light emitting/receiving device.

10. An interbay transfer interface between an AMHS and a stocker according to claim 1, wherein each of said plurality of containers further comprises a removable cover for sealing said open top from dust.

11. A method for the interbay transfer of an object between an AMHS and a stocker by the steps of:
    positioning a conveyor belt juxtaposed to input/output ports of a first and a second stocker capable of moving an object therein between;
    positioning and carrying a plurality of containers on and by said conveyor belt, each of said plurality of containers further comprises:
        an open top for receiving said object from said AMHS therein;
        an aperture in each of two opposing sidewalls forming a light passageway perpendicular to said conveyor belt, said aperture being formed in said sidewall; and
        at least two apertures in a bottom wall of said container for penetrating by at least two locating pins on said conveyor belt;
    providing at least two locating pins on said conveyor belt and engaging said at least two apertures in said bottom wall of the container, said locating pins further comprises sensors for sensing the presence of a container placed on top;
    sending a wave by a wave emitting/receiving device positioned juxtaposed to said conveyor belt through said apertures in said opposing sidewalls of the container and sensing the presence or absence of an object in said container;
    sending signals to a controller from said wave emitting/receiving device and said sensors on said locating pins indicating a full/empty status of said container; and
    conveying said object in said container from said first stocker to said second stocker.

12. A method for the interbay transfer of an object between an AMHS and a stocker according to claim 11 further comprising the step of covering said open top of said container with a dust-proof cover.

13. A method for the interbay transfer of an object between an AMHS and a stocker according to claim 11 further comprising the step of sending an infrared light by an infrared emitting/receiving device through said apertures in said opposing sidewalls of the container.

14. A method for the interbay transfer of an object between an AMHS and a stocker according to claim 11 further comprising the step of sending an ultrasonic wave by an ultrasonic wave emitting/receiving device through said apertures in said opposing sidewalls of the container.

15. A method for the interbay transfer of an object between an AMHS and a stocker according to claim 11 further comprising the step of mounting a plurality of plates spaced-apart on said conveyor belt, each of said plurality of plates comprises at least two locating pins for receiving said at least two apertures in said bottom wall of the container.

16. A method for the interbay transfer of an object between an AMHS and a stocker according to claim 11 further comprising the step of:
    providing an indented area in a top surface of the bottom wall of the container; and
    positioning a wafer cassette in said indented area.

* * * * *